June 18, 1968 S. S. ACONSKY 3,389,267

PHOTOELECTRIC CELL WITH HEAT SINK

Filed Sept. 10, 1965

INVENTOR:
SIMON S. ACONSKY

BY J. B. Burke

ATTORNEY

United States Patent Office 3,389,267

Patented June 18, 1968

3,389,267

PHOTOELECTRIC CELL WITH HEAT SINK

Simon S. Aconsky, Long Island City, N.Y., assignor to Clairex Corporation, New York, N.Y., a corporation of New York Filed Sept. 10, 1965, Ser. No. 486,439

8 Claims. (Cl. 250—238)

This invention relates to the art of photoelectric cell construction and more particularly concerns both an improved photoelectric cell structure and a novel method of manufacture thereof. The invention is especially directed at improvements in a photoelectric cell of the photoconductive type having internal electrical resistance or conductance which varies as light impinging thereon varies in intensity.

Photoconductive cells generally employ photosensitive elements which have a characteristic of being affected adversely in sensitivity by excess heating applied internally or externally, to the point where their photosensitivity is lost or materially degraded. This characteristic serves as a limiting factor preventing manufacture heretofore of photoconductive cells having high power dissipation ability.

The prior workers in the art have tried many expedients to ameliorate this condition without success. The present invention has been directed at and has solved the problem in a surprisingly simple and effective manner.

According to the invention a massive, thick-walled tubular shell having excellent heat conducting properties, and low thermal inertia, is thermally shrunk on to the periphery of a photoconductive wafer. This wafer may be a disk bearing a photosensitive photoconductive element or elements with spaced electrodes, or it may itself be a photoconductor with spaced electrodes thereon. The result is a virtual hermetic seal between shell and wafer with perfect mechanical peripheral engagement to provide a continuous heat sink all around the wafer. The shell extends axially beyond the wafer and serves as a light shield and light guide member. A chamber is defined within the shell closed at one end by the wafer. This chamber is filled with a transparent body which serves as a lens. The transparent body also serves a closure for the cell while the shell is engaged in tension with the transparent body to serve as a heat sink therefor and to provide a virtual hermetic seal therewith. The photoconductive cell having the basic structure described has a higher power dissipation ability than any prior known photoconductive cells of equal size. It is more economical to manufacture and is more rugged in construction.

The disk, base or wafer of the cell embodying the invention may be round, square or of other geometrical shape, and the tubular shell will have a corresponding cross sectional shape. The wafer may be made of ceramic, glass or other rigid electrical insulation material when it serves as the substrate for the photoconductive element and electrodes overlaying it. If the wafer is made of photoconductive material itself, such as compressed, sintered activated cadmium sulphide or the like, it will be a hard rigid element. The tubular shell will be made of a material having low thermal inertia as compared with that of the wafer. It may be made of metal, quartz, metal-filled plastic, glass or other rigid material which expands on being heated and shrinks on cooling. The total mass of the shell should be two or more times that of the photoconductive wafer, and should have a free thermal radiation surface two or more times as large as that of the wafer, to abosrb heat quickly from the wafer and to dissipate the heat by radiation and conduction to ambient air.

It has been known to enclose a photoconductive wafer in a metal container which simply serves as an enclosure or casing. Such a thin metal casing provides a poor heat sink since it does not readily protect the photoconductive wafer from overheating. Where the thin metal casing is crimped or is otherwise mechanically fastened to the photoconductive wafer by auxiliary fastening means, the crimping or fastening process causes distortion of the metal casing so that the sensitive element is not hermetically sealed. This leads to early failure of the photoconductive cell due to leakage in and exposure to air and moisture. Also the thin metal casing imperfectly and incompletely engages the periphery of the photoconductive wafer so that the casing does not serve as a fully effective heat sink. Furthermore the crimping or fastening process requires one or more additional manufacturing steps, and use of fastening materials, all of which are costly in time and labor to apply and material to supply. In addition rather complex, expensive precise machinery requiring skilled operators is required to perform the crimping or fastening operations. These unduly increase the cost of manufacture.

Among the fastening materials used heretofore has been solder. It has been known to apply an annular fillet of solder to a thin metal casing for a photoconductive wafer to secure the wafer and casing together. This construction as above mentioned for crimping, provides poor protection to the photosensitive element from internally and externally applied heat. It has numerous disadvantages which preclude its use in a photoconductive cell having high power dissipation ability. It has been found extremely difficult to apply a complete annulus or ring of solder to effect hermetic sealing between the metal casing and photoconductive wafer. Even if the required skilled operators, complex machinery and associated precision instrumentation and equipment are available, the soldering process requires at least several seconds for heating the solder to melt it and several more seconds to cool the solder. During this time the photosensitive element is invariably adversely affected in sensitivity so that it fails at once or eventually, sooner or later, in service due to its prior history of excess heating. Furthermore the metal casing fits frictionally only to the wafer at spaced points. The periphery seal to the wafer is not perfect. Thus the shell fails to serve as both a perfect heat sink and as a hermetic sealing member. Other objects are high costs in time, labor, materials and equipment required to effect solder sealing.

Substitution of cements or adhesive for solder fastening does not remedy the situation because adhesives deteriorate in time causing leakage of air and moisture and the adhesives are poor conductors of heat. Also they fail to join the metal casings in perfect mechanical engagement with the photoconductive wafer.

A basic fault in all photoconductive cells employing thin metal casings whose thickness is generally much less than that of the photoconductive wafers is the relatively high thermal inertia of the casings. The thin metal casings cannot absorb much heat. Their heat absorption rate is limited by their ability to radiate heat. As a result satisfactory photoconductive cells having high heat and power dissipation abilities cannot be produced by use of thin metal casings or shells. The same objections are encountered when photoconductive wafers are encapsulated in thin glass casings. The thin material makes for a poor heat sink.

It is therefore a principal object of the invention to provide a photoconductive cell of simplified and improved construction which has greater heat dissipation ability than prior photoconductive cells.

Another object is to provide a novel method of manufacture or assembly of a photoconductive cell having high heat dissipation ability.

Another object is to provide a photoconductive cell including a photoconductive wafer, with a uniformly tensioned, thermal conductive massive tubular shell extending around the entire periphery of the wafer and away axially from the wafer, the shell being in perfect mechanical engagement with the wafer and forming a virtual hermetic seal therewith.

A further object is to provide a photoconductive cell as last described wherein the shell has a positive coefficient of thermal expansion and is applied by thermal contraction around the photoconductive wafer.

Another object is to provide a photoconductive cell having high heat dissipation ability, which cell can be manufactured more economically than prior cells of similar type, with economies effected in time, labor, materials and equipment used for encapsulating the cell.

Other objects are to provide an encapsulated photoconductive cell which has greater heat dissipation capacity than prior photoconductive cells of like size; which is sealed without subjecting the photoconductive wafer or photosensitive element in the cell to adverse heating conditions; in which the photoconductive element is enclosed in a virtual hermetic sealed enclosure; in which a massive tubular shell serves as a heat sink; and which employs no supplementary fastening elements.

Other objects and advantages of the invention will become apparent from the following description taken together with the drawing, wherein.

Figures 1, 2, 3, 4, 5, 6:
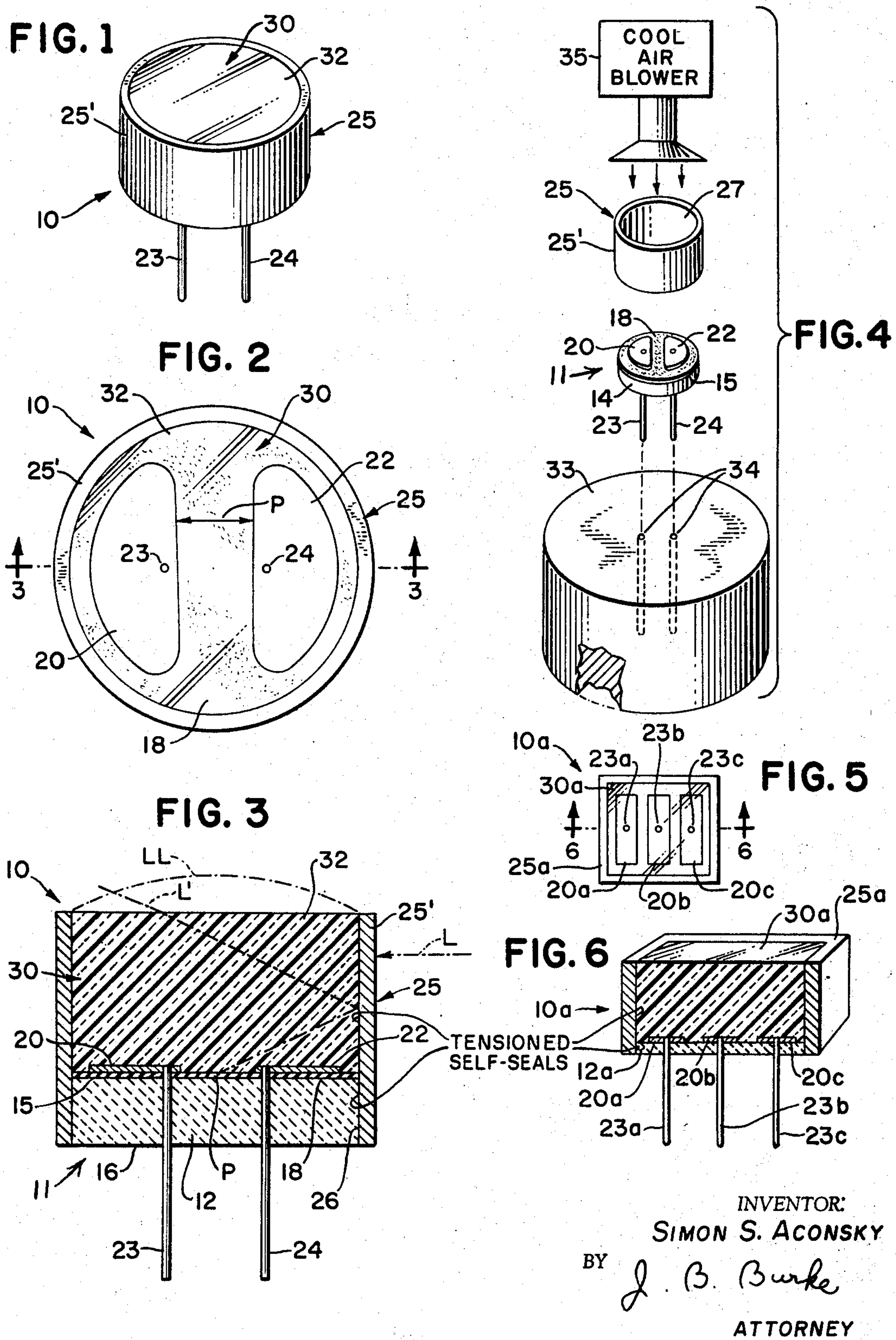
FIG. 1 is a perspective view of a photoconductive cell embodying the invention.
FIG. 2 is an enlarged top plan view of the cell of FIG. 1.
FIG. 3 is a central sectional view taken on line 3—3 of FIG. 2.
FIG. 4 is an exploded perspective view of parts of the cell shown at a step in the assembly process, with associated apparatus.
FIG. 5 is a top plan view of another photoconductive cell embodying the invention.
FIG. 6 is an enlarged perspective view partially in section, taken on line 6—6 of FIG. 5.

Referring to the drawing, there is shown in FIGS. 1–3, photoconductive cell 10. The cell has a wafer 11 which includes a flat, circular substrate or disk 12 having a cylindrical outer periphery 14 and two flat opposite sides 15, 16. Disposed on upper side 15 of the disk and adhering thereto is a thin layer 18 of a photosensitive, photoconductive material such as activated cadmium sulphide or the like of a type well known in the art. On layer 18 are two thin, flat electrodes 20, 22 spaced apart so that electric current passing from one electrode to the other must pass through at least a portion P of the photoconductive material. A pair of narrow gauge metal lead wires 23, 24 are embedded in the body of disk 12. The wires pass through the disk and terminate at the electrodes 20, 22 respectively. These wires may be soldered or welded to the electrodes. They serve as leads for electric current passed through the photosensitive portion P via the electrodes. These lead wires can be connected to an external circuit. The disk 12 may be made of ceramic material or other rigid electrical insulation material. To the extent described, the structure of the cell 10 is conventional.

Now according to the invention, there is provided a massive tubular cylindrical shell 25 open at both ends. The shell is thermally shrunk around the periphery 14 of the wafer 11 at one end of the shell so that complete contact exists between periphery 14 at all points and one end part of the inner side 26 of the shell.

FIG. 4 shows a step in the assembly process. The shell 25, preheated in an oven or by other suitable external means (not shown), is placed axially downward on the wafer 11 which rests on a cool massive metal block 33. A continuous current of cool or cold air from a blower 35 passes through the cylindrical passage 27 in the shell to the top of the wafer where the air cools the sensitive layer 18, electrodes 20, 22 and disk 12. The shell 25 which has previously been expanded in diameter by heating is cooled in the air stream. It is quickly fitted to the wafer 11 and contracts thereon to grip it in tension. The relative dimensions of the disk 12 and shell 25 are carefully chosen so that when the shell is heated sufficiently its diameter will be several ten-thousandths of an inch (tenths of a mil) larger than that of the disk 12, and will be several tenths of a mil smaller than the diameter of the disk when the shell is cool and off the disk. If the lead wires 23 and 24 are attached to the wafer before mounting of the shell 25, these wires will extend into holes 34 in the block 33. Otherwise these wires will be attached after the shell is secured to the wafer 11 by thermal shrinking as described.

It will be noted that a portion 25' of the axial length of the shell extends axially away from wafer 11. This defines a cylindrical cavity with wafer 11. The cavity is filled with a transparent plastic cold setting body 30. The material of the plastic body 30 is of such a type that it expands slightly on setting to solid, rigid form. This material may be an acrylic, epoxy or the like. The body 30 tensions the upper part 25' of the shell on setting and thus maintains a virtual hermetic sealing relationship therewith at all points. Lower side 16 of the wafer 11 is exposed to radiate heat freely.

In the process illustrated by FIG. 4, it may be possible to omit blower 35 and the cold air blast it provides, if block 33 is sufficiently massive and cool enough to conduct heat rapidly away from the heated shell 25 as it is forced down quickly on wafer 11, so that the shell shrinks and cools before it can conduct any material amount of heat to the wafer.

The shell 25 serves as a heat sink for the disk 12, element 18, electrodes 20, 22, lead wires 23, 24 and transparent body 30. The shell conducts heat away from these parts and radiates it outwardly away from the sensitive layer 18. In operation light passes through the transparent body 30 and impinges on the exposed part P of layer 18. This effects a change in electrical resistance or conductance of the layer. Any electric current passing through portion P of layer 18 between electrodes 20, 22 will be varied in magnitude due to the change in electrical resistance or conductance. Heat generated internally in the layer 18 will be conducted away by disk 12 to the shell 25 which will radiate it outwardly into ambient air.

The shell 25 also serves as a support and heat sink for the body 30 as above mentioned. It further serves as a light guide. It excludes light approaching angularly to the cell from transverse directions such as direction L. Also any light entering the transparent body 30, which is actually a lens, may pass obliquely in a line such as L' to strike the inside surface 26 of the shell. The light will then be internally reflected in body 30 to the layer 18. The exposed end 32 of body 30 may be rounded or shaped as indicated by dotted line LL in FIG. 3 to define a convex lens which will concentrate incident light upon part P of layer 18 between electrodes 20, 22. If desired the surface 32 of body 30 can be concave.

In FIGS. 5 and 6 is shown a photoconductive cell **10*a* which has a rigid rectangular photoconductive wafer 11*a* on the periphery of which is thermally shrunk one end of a rectangular tubular shell 25*a*. The shell is open at both ends. Three electrodes 20*a*, 20*b* and 20*c* are mounted in spaced positions on top of the wafer. Wire leads 23*a*, 23*b* and 23*c* extend through wafer 12*a* to the electrodes respectively. Transparent plastic body or lens 30*a* fills the cavity defined by the end portion of shell 25*a* extending axially beyond the wafer and by the upper side of the wafer. Cell 10*a* can be assembled in the same manner as described in connection with FIG. 4 for cell 10**.

It will be noted that the cells 10 and **10*a*** employ no supplementary fasteners, adhesives, solder or the like. No crimping or bending operations are involved. The cells have the simplest possible structures. Nevertheless each is a permanently sealed unit completely protected against abnormal temperatures of heat applied internally or externally to the photoconductive wafer. The shells are self-sealed in tension to the wafers and lenses. The cells have very strong solid structures. No internal parts are free to vibrate. External air, dust and moisture are effectively excluded from the interiors of the cells.

Instead of being round or rectangular in cross section as illustrated, the shells and wafers may have other geometric shapes, such as hexagonal, elliptical, etc. Two, three or more electrodes and lead wires can be provided in cells of both types illustrated by cell 10 and cell 10*a*, depending on requirements. The lead wires can be soldered or welded to the electrodes by conventional methods. The electrodes may have other shapes than those illustrated in the drawing.

The shells 25 and 25*a* can be made of aluminum, quartz, reinforced plastic or other rigid material having low thermal inertia and a positive temperature coefficient of expansion. Wafers 11 and 11*a* can be made of any suitable rigid insulation material such as ceramic, plastic, glass, artificial mica or the like. Wafer 11 wll be made of a rigid, photoconductive material.

The cells can be manufactured more economically than other photoconductive cells of comparative size having more complex structures. For their size they will have greater power carrying capacity and greater heat dissipation ability than other prior photoconductors of like size.

I claim:

1. A photoelectric cell, comprising a photoconductive disk-like wafer having a peripheral wall and two opposing sides, a massive thermally conductive tubular shell open at both ends, said shell having one tensioned end portion extending around said wafer in virtual hermetic sealing engagement with the entire periphery of the wafer, said shell having another end portion extending axially away from one side of the wafer to define a chamber therewith, and a massive, transparent, solid body constituting a lens filling said chamber, said other end portion of the shell having its inner side disposed in tensioned hermetic sealing engagement with the periphery of said body, said shell having less thermal inertia and more thermal conductivity than both said wafer and said body, whereby said shell serves as a heat sink to conduct heat away from said wafer and said body and effectively protect the wafer from damage by said heat.

2. A photoelectric cell according to claim 1, wherein the other side of said wafer is exposed at said one end of the shell to radiate heat freely therefrom.

3. A photoelectric cell according to claim 2, further comprising spaced electrodes on said one side of the wafer, and electrically conductive lead wires extending axially through said wafer and terminating in electrical contact with said electrodes for passing electric current between said electrodes via a photoconductive portion of said wafer exposed to light passing through said body and impinging on said photoconductive portion of the wafer.

4. A photoelectric cell according to claim 1, wherein said shell is a cylinder.

5. A photoelectric cell according to claim 1, wherein said shell is polygonal in cross section.

6. A photoelectric cell according to claim 3, wherein said other end portion of the shell serves to exclude light approaching the cell from directions laterally thereof, said body having an exposed end portion at the other end of the shell curved to concentrate light passing through said body on to said wafer.

7. A photoelectric cell, comprising a disklike substrate having a cylindrical peripheral wall and two opposing flat circular sides, a photoconductive layer on one side of the substrate, spaced electrodes in electrical contact with said layer, a massive thermally conductive tubular, cylindrical shell having one tensioned end portion extending around said substrate in virtual hermetic sealing engagement with the entire peripheral wall of said substrate, said shell having another end portion extending axially away from one side of said substrate to define a chamber therewith, and a massive, transparent, solid lens filling said chamber, said other end portion of the shell being disposed in tensioned virtual hermetic sealing engagement with the periphery of said lens, said shell having less thermal inertia and greater thermal conductivity than both said substrate and said lens, whereby said shell serves as a heat sink to conduct heat away from said substrate and lens and effectively protects the photoconductive layer from damage by heat, the other side of said substrate being exposed at said one end of the shell to radiate heat freely therefrom, and electrically conductive elements extending axially through the substrate and terminating in electrical contact with the electrodes respectively for passing electric current between the electrodes via a portion of said layer exposed to light passing through said lens and impinging on said portion of the layer.

8. A radiation sensitive cell, comprising a radiation sensitive wafer, a tubular thermally conductive shell having one end thermally shrunk on the periphery of the wafer and having its other end extending axially from the wafer, and a lens transparent to said radiation filling said other end of the shell, said lens being composed of plastic material expanded by setting to solid form, said shell being circumferentially tensioned both by said lens and by said wafer to form virtual hermetic seals therewith, with complete, continuous thermally conductive contact between said shell and both said lens and said wafer, the thermal inertia of said shell being less than that of said wafer and said lens respectively, and the thermal conductivity of the shell being greater than that of the lens and wafer respectively, to protect said wafer from adverse heating effects.

References Cited

UNITED STATES PATENTS

| | | | |
|---|---|---|---|
| 2,839,646 | 6/1958 | Hester | 250—239 X |
| 3,178,621 | 4/1965 | Glickman | 317—234 |
| 3,183,361 | 5/1965 | Bronson et al. | 250—239 |

JAMES W. LAWRENCE, *Primary Examiner.*

V. LAFRANCHI, *Assistant Examiner.*